(12) United States Patent
Yamawaku et al.

(10) Patent No.: US 11,935,727 B2
(45) Date of Patent: Mar. 19, 2024

(54) SUBSTRATE PROCESSING METHOD

(71) Applicant: Tokyo Electron Limited, Tokyo (JP)

(72) Inventors: Jun Yamawaku, Nirasaki (JP); Chishio Koshimizu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 817 days.

(21) Appl. No.: 16/990,166

(22) Filed: Aug. 11, 2020

(65) Prior Publication Data
US 2020/0373131 A1 Nov. 26, 2020

Related U.S. Application Data

(63) Continuation of application No. 15/935,275, filed on Mar. 26, 2018, now Pat. No. 10,777,392, which is a (Continued)

(30) Foreign Application Priority Data

Jan. 7, 2011 (JP) ................................. 2011-002250

(51) Int. Cl.
H01J 37/32 (2006.01)
B08B 9/28 (2006.01)
(Continued)

(52) U.S. Cl.
CPC .. H01J 37/32642 (2013.01); H01J 37/32724 (2013.01); B08B 9/286 (2013.01);
(Continued)

(58) Field of Classification Search
CPC .......... H01J 37/32642; H01J 37/32724; H01J 37/32385; B08B 9/286; C09K 13/00; C23F 4/00; H01L 21/3065
See application file for complete search history.

(56) References Cited

U.S. PATENT DOCUMENTS

2003/0106646 A1 6/2003 Ma
2004/0241995 A1 12/2004 Yamanaka
(Continued)

FOREIGN PATENT DOCUMENTS

CN 1973363 A 5/2007
EP 0676790 A1 * 10/1995
(Continued)

OTHER PUBLICATIONS

Machine Translation of KR783062B1 (Year: 2007).*

*Primary Examiner* — Sharidan Carrillo
(74) *Attorney, Agent, or Firm* — Pearne & Gordon LLP

(57) ABSTRACT

There is provided a focus ring that is capable of preventing deposits from adhering to a member having a lower temperature in a gap between two members having different temperatures. A focus ring 25 is disposed to surround a peripheral portion of a wafer W in a chamber 11 of a substrate processing apparatus 10. The focus ring 25 includes an inner focus ring 25a and an outer focus ring 25b. Here, the inner focus ring 25a is placed adjacent to the wafer W and configured to be cooled; and the outer focus ring 25b is placed so as to surround the inner focus ring 25a and configured not to be cooled. Further, a block member 25c is provided in a gap between the inner focus ring 25a and the outer focus ring 25b.

11 Claims, 6 Drawing Sheets

Related U.S. Application Data continuation of application No. 13/344,926, filed on Jan. 6, 2012, now abandoned.

(60) Provisional application No. 61/435,086, filed on Jan. 21, 2011.

(51) Int. Cl.
  *C09K 13/00* (2006.01)
  *C23F 4/00* (2006.01)
  *H01L 21/3065* (2006.01)

(52) U.S. Cl.
  CPC .............. *C09K 13/00* (2013.01); *C23F 4/00* (2013.01); *H01J 37/32385* (2013.01); *H01L 21/3065* (2013.01)

(56) References Cited

U.S. PATENT DOCUMENTS

| | | |
|---|---|---|
| 2005/0061447 A1 | 3/2005 | Kim et al. |
| 2005/0155718 A1 | 7/2005 | Huang |
| 2007/0215279 A1 | 9/2007 | Koshiishi |
| 2010/0213171 A1 | 8/2010 | Koshimizu et al. |
| 2011/0031111 A1* | 2/2011 | Kobayashi ........ H01J 37/32623 204/298.36 |
| 2012/0175063 A1* | 7/2012 | Yamawaku ....... H01L 21/67069 156/345.46 |
| 2014/0124139 A1 | 5/2014 | Koshiishi et al. |
| 2018/0019107 A1* | 1/2018 | Ishizawa ........... H01J 37/32899 |
| 2020/0365405 A1* | 11/2020 | Zucker ................. H01J 37/321 |
| 2020/0373131 A1* | 11/2020 | Yamawaku ....... H01J 37/32724 |
| 2022/0319904 A1* | 10/2022 | Rice ................. H01L 21/68735 |

FOREIGN PATENT DOCUMENTS

| | | |
|---|---|---|
| JP | 11-026563 A | 1/1999 |
| JP | 2004-200353 A | 7/2004 |
| JP | 2007-258500 A | 10/2007 |
| JP | 2009-224385 A | 10/2009 |
| JP | 2010-021079 A | 1/2010 |
| JP | 2010-165798 A | 7/2010 |
| JP | 2010-251723 A | 11/2010 |
| KR | 10-2003-0074833 A | 9/2003 |
| KR | 10-2007-0022781 A | 2/2007 |
| KR | 10-0783062 B1 | 12/2007 |
| KR | 10-2009-0026321 A | 3/2009 |

* cited by examiner

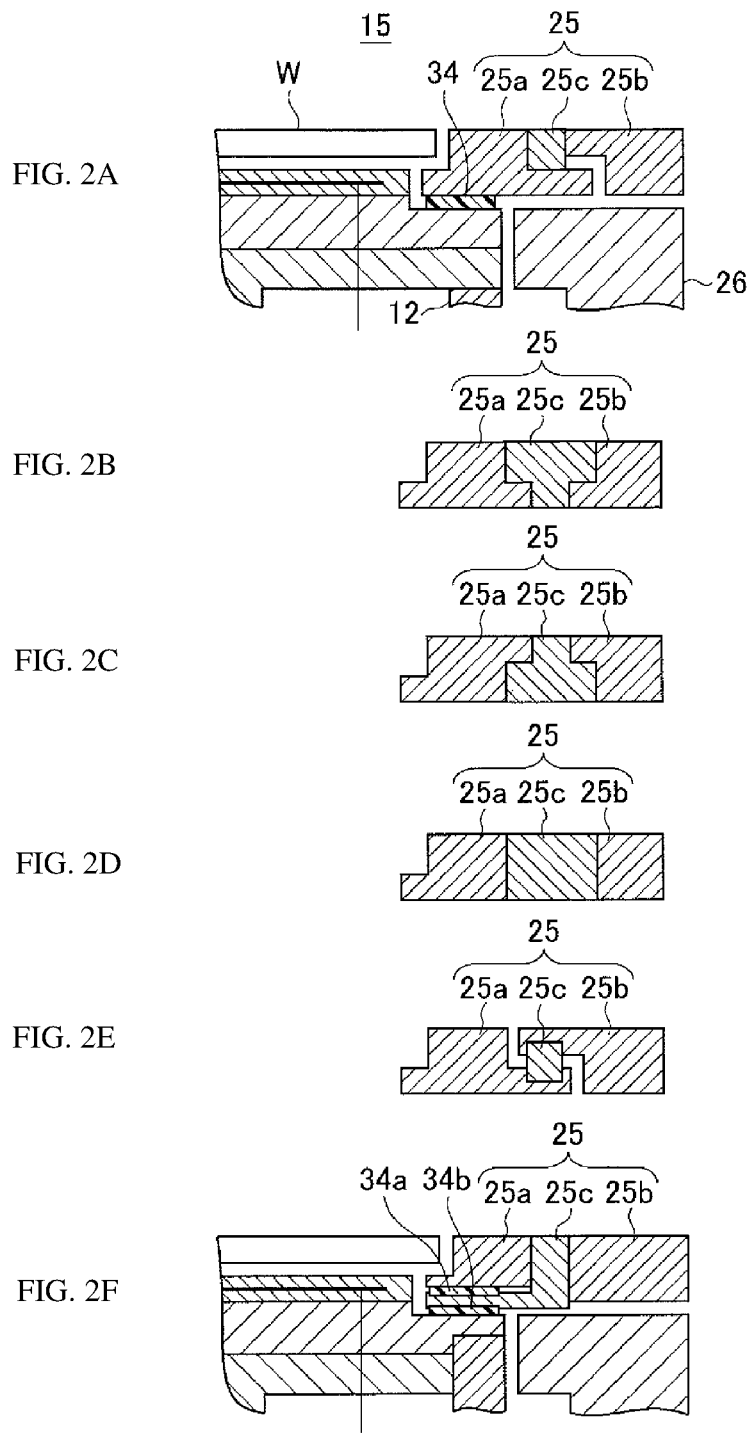

SUBSTRATE PROCESSING METHOD

CROSS-REFERENCE TO RELATED APPLICATION

This is a continuation application of U.S. patent application Ser. No. 15/935,275, filed on Mar. 26, 2018, which claims the benefit of Japanese Patent Application No. 2011-002250 filed on Jan. 7, 2011, U.S. Provisional Application Ser. No. 61/435,086 filed on Jan. 21, 2011, and U.S. patent application Ser. No. 13/344,926 filed on Jan. 6, 2012, the entire disclosures of which are incorporated herein by reference.

TECHNICAL FIELD

The present disclosure relates to a substrate processing apparatus.

BACKGROUND

Recently, as a semiconductor wafer (hereinafter, simply referred to as a "wafer"), on which semiconductor devices is to be formed, is scaled up, it has been required to manufacture semiconductor devices even on a peripheral region of the wafer W, e.g., on a range within about 10 mm from an edge of the wafer toward a center thereof. Usually, a temperature distribution of the wafer affects a distribution of radicals in plasma by which a plasma process is performed on the wafer. Thus, in order to perform a uniform plasma process on the entire region of the wafer, the temperature of the peripheral region of the wafer needs to be controlled to be substantially the same as the temperature of the other region of the wafer. For the purpose, conventionally, there has been developed a technique for controlling the temperature of the focus ring to cool the focus ring in order to reduce radiant heat from the focus ring.

However, if the entire wafer temperature becomes lower as the focus ring is cooled, a resist film coated on the wafer as a pattern mask is easily etched by the plasma. Thus, in order to prevent a great decrease of the entire wafer temperature, the present applicant has developed a technique in which a first focus ring (hereinafter, referred to as an "inner focus ring") is provided and a second focus ring (hereinafter, referred to as an "outer focus ring") is placed at an outside of the first focus ring, and the first focus ring is cooled whereas the outer focus ring is not cooled but it is rather heated (see, for example, Patent Document 1).

Patent Document 1: Japanese Patent Application No. 2010-021079

Generally, in a gap between two members having greatly different temperatures, deposits are likely to adhere to a member having a lower temperature. Actually, the present inventor has found out that, when the aforementioned so-called dual focus ring including the inner focus ring and the outer focus ring is used, deposits tends to easily adhere to the inner focus ring in a gap between the inner and outer focus rings Since the gap between the inner focus ring and the outer focus ring is narrow and the plasma cannot be introduced into the gap easily, it is difficult to remove the deposits adhering to the inner focus ring by aching or the like. Thus, in order to remove the deposits from the inner focus ring, it is required that a chamber is opened to the atmosphere and the inner focus ring is taken out. As a result, an operation rate of a substrate processing apparatus including the focus ring would be deteriorated.

Further, in the substrate processing apparatus, a susceptor on which the inner focus ring or the outer focus ring are mounted is cooled to a temperature lower than the temperature of the inner focus ring. Accordingly, a temperature difference between the inner focus ring and the susceptor is increased. As a result, deposits adhere to the susceptor in a gap between the inner focus ring and the susceptor.

Since the gap between the focus ring and the susceptor is also narrow, in order to remove the deposits from the susceptor, it is required the chamber is opened to the atmosphere and the inner focus ring is taken out to expose the susceptor. As a result, the operation rate of the substrate processing apparatus would be also deteriorated.

SUMMARY

In view of the foregoing problems, the present disclosure provides a focus ring capable of preventing deposits from adhering to a member having a lower temperature in a gap between two members having different temperatures. Further, the present disclosure also provides a substrate processing apparatus having this focus ring.

In accordance with one aspect of the present disclosure, there is provided a focus ring disposed to surround a peripheral portion of a substrate in a processing chamber of a substrate processing apparatus. The focus ring includes an inner focus ring placed adjacent to the substrate and configured to be cooled; an outer focus ring placed so as to surround the inner focus ring and configured not to be cooled; and a quartz member placed in a gap between the inner focus ring and the outer focus ring.

Further, the quartz member may be exposed to a processing space in which plasma is generated within the processing chamber.

Here, a mounting table for mounting thereon the substrate and the inner focus ring may be provided within the processing chamber, and the quartz member may be extended to be placed between the inner focus ring and the mounting table.

In accordance with another aspect of the present disclosure, there is provided a substrate processing apparatus that includes a processing chamber for accommodating a substrate therein; and a focus ring disposed to surround a peripheral portion of a substrate in the processing chamber. Here, the focus ring includes an inner focus ring placed adjacent to the substrate and configured to be cooled; an outer focus ring placed so as to surround the inner focus ring and configured not to be cooled; and a quartz member placed in a gap between the inner focus ring and the outer focus ring.

In accordance with still another aspect of the present disclosure, there is provided a substrate processing apparatus that includes a processing chamber for accommodating a substrate therein; a focus ring configured to surround a peripheral portion of the substrate disposed in the processing chamber; and a mounting table for mounting thereon the substrate and the focus ring. Here, the focus ring includes an inner focus ring placed adjacent to the substrate and configured to be cooled, and an outer focus ring placed so as to surround the inner focus ring and configured not to be cooled. Further, the mounting table is configured to be cooled such that a temperature of the mounting table becomes lower than that of the inner focus ring, and a quartz member is placed in a gap between the inner focus ring and the mounting table.

In the substrate processing apparatus, the quartz member may be placed between the inner focus ring and a mounting surface of the mounting table on which the inner focus ring is mounted.

Further, the quartz member may be extended to be placed in a gap between the inner focus ring and the outer focus ring. Alternatively, a quartz member may be further provided in a gap between the inner focus ring and the outer focus ring.

In accordance with still another aspect of the present disclosure, there is provided a processing chamber for accommodating a substrate therein; a focus ring disposed to surround a peripheral portion of the substrate in the processing chamber; a mounting table for mounting thereon the substrate and the focus ring; and a gas supply unit configured to supply a gas into a gap between the focus ring and the mounting table. Here, the focus ring includes an inner focus ring placed adjacent to the substrate and configured to be cooled; and an outer focus ring placed so as to surround the inner focus ring and configured not to be cooled. Further, the gas supply unit is configured to supply the gas into at least one of a gap between the inner focus ring and the outer focus ring and a gap between the inner focus ring and the mounting table.

The gas supplied by the gas supply unit may include an oxygen gas.

The gas supplied by the gas supply unit may be a nonreactive gas.

The gas supplied by the gas supply unit may be a processing gas.

In accordance with still another aspect of the present disclosure, there is provided a focus ring disposed to surround a peripheral portion of a substrate in a processing chamber of a substrate processing apparatus. The focus ring includes an inner focus ring placed adjacent to the substrate and configured to be cooled; and an outer focus ring placed so as to surround the inner focus ring and configured not to be cooled. Here, the inner focus ring has a thin-plate shape flange exposed to a processing space within the processing chamber and protruded so as to cover a part of the outer focus ring.

The flange of the inner focus ring may have a thickness ranging from about 1.7 mm to about 2.0 mm.

In accordance with still another aspect of the present disclosure, there is provided a substrate processing apparatus that includes a processing chamber for accommodating a substrate therein; and a focus ring disposed to surround a peripheral portion of the substrate in the processing chamber. Here, the focus ring includes an inner focus ring placed adjacent to the substrate and configured to be cooled; and an outer focus ring placed so as to surround the inner focus ring and configured not to be cooled; and the inner focus ring has a thin-plate shape protrusion exposed to a processing space within the processing chamber and extended so as to cover a part of the outer focus ring.

In accordance with the present disclosure, since the quartz member is disposed between the inner focus ring and the outer focus ring, the oxygen radicals are generated when the plasma comes into contact with the quartz member in the gap between the inner focus ring and the outer focus ring. The oxygen radicals may easily decompose and remove deposits, so that it can be prevented that the deposits adhere to the inner focus ring having a lower temperature in the gap between the inner focus ring and the outer focus ring of which temperatures are greatly different.

Further, in accordance with the present disclosure, since the quartz member is disposed between the inner focus ring and the mounting table, the oxygen radicals are generated when the plasma comes into contact with the quartz member in the gap between the inner focus ring and the mounting table. The oxygen radicals may easily decompose and remove deposits, so that it can be prevented that the deposits adhere to the mounting table having a lower temperature in the gap between the inner focus ring and the mounting table of which temperatures are greatly different.

Moreover, in accordance with the present disclosure, since the gas supply unit supplies the gas into at least one of the gap between the inner focus ring and the outer focus ring and the gap between the inner focus ring and the mounting table, the supplied gas may push out reaction products, as a source of deposits, that have entered the gap between the inner focus ring and the outer focus ring or the gap between the inner focus ring and the mounting table. Accordingly, it may be possible to prevent deposits from adhering to the inner focus ring having the lower temperature in the gap between the inner focus ring and the outer focus ring of which temperatures are greatly different. Likewise, it may also be possible to prevent deposits from adhering to the mounting table having the lower temperature in the gap between the inner ring and the mounting table of which temperatures are greatly different.

In addition, in accordance with the present disclosure, the inner focus ring has the thin-plate shape flange exposed to the processing space within the processing chamber and protruded so as to cover the outer focus ring. Therefore, the temperature of the flange may be increased by receiving radiant heat from the plasma in the processing space, so that a temperature difference between the inner focus ring and the outer focus ring can be reduced in the vicinity of the flange. As a result, at least in the vicinity of the flange, it may be possible to prevent deposits from adhering to the inner focus ring having the lower temperature in the gap between the inner focus ring and the outer focus ring.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIGS. 2A-2F provides enlarged cross sectional views schematically illustrating configurations of a focus ring in the substrate processing apparatus of FIG. 1; FIG. 2A shows a focus ring in accordance with the first embodiment of the present disclosure; FIG. 2B, a first modification example of the focus ring in accordance with the first embodiment; FIG. 2C, a second modification example of the focus ring in accordance with the first embodiment; FIG. 2D, a third modification example of the focus ring in accordance with the first embodiment; FIG. 2E, a fourth modification example of the focus ring in accordance with the first embodiment; and FIG. 2F, a fifth modification example of the focus ring in accordance with the first embodiment;

FIG. 3A shows a focus ring in accordance with the second embodiment of the present disclosure; FIG. 3B, a first modification example of the focus ring in accordance with the second embodiment;

FIG. 3C, a second modification example of the focus ring in accordance with the second embodiment; and FIG. 3D, a third modification example of the focus ring in accordance with the second embodiment;

FIG. 4A shows a focus ring in accordance with the third embodiment of the present disclosure and FIG. 4B shows a first modification example of the focus ring in accordance with the third embodiment;

FIG. 6A depicts a first example and FIG. 6B depicts a second example;

FIG. 7A depicts a third example and FIG. 7B depicts a fourth example; FIG. 8A depicts a fifth example; FIG. 8B, a sixth example; FIG. 8C, a seventh example; and FIG. 8D, an eighth example.

DETAILED DESCRIPTION

Hereinafter, illustrative embodiments of the present disclosure will be described with reference to the accompanying drawings.

First, a substrate processing apparatus in accordance with a first embodiment of the present disclosure will be explained.

Figure 1:
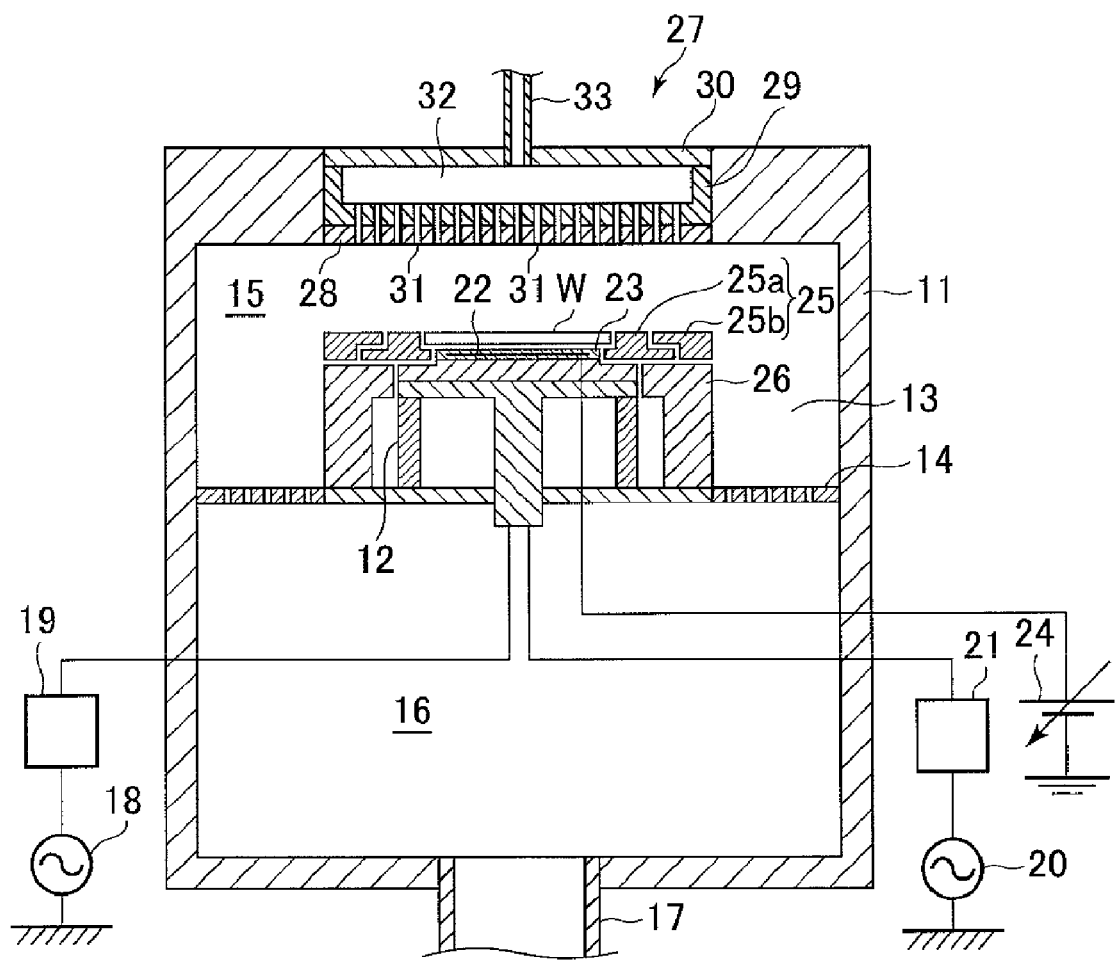
FIG. 1 is a schematic configuration view of a substrate processing apparatus in accordance with a first embodiment of the present disclosure.

FIG. 1 is a schematic configuration view of the substrate processing apparatus in accordance with the first embodiment. The substrate processing apparatus is configured to perform a plasma etching process on a wafer as a substrate for a semiconductor device (hereinafter, simply referred to as a "wafer").

Referring to FIG. 1, a substrate processing apparatus 10 includes a chamber 11 for accommodating therein a wafer W having a diameter of, e.g., about 300 mm. A circular column-shaped susceptor 12 (mounting table) for mounting thereon the wafer W is provided in the chamber 11. In this substrate processing apparatus 10, a side exhaust path 13 is formed between an inner sidewall of the chamber 11 and a side surface of the susceptor 12. An exhaust plate 14 is provided on the way of the side exhaust path 13.

The exhaust plate 14 is a plate-shaped member having a multiple number of through holes. The exhaust plate 14 serves as a partition plate that partitions an inside of the chamber 11 into an upper portion and a lower portion. As will be described later, plasma is generated in an inner space (processing space) within the upper portion 15 (hereinafter, referred to as a "processing chamber") of the chamber 11 above the exhaust plate 14. Further, an exhaust pipe 17 for exhausting a gas within the chamber 11 is connected to the lower portion 16 (hereinafter, referred to as an "exhaust chamber (manifold)") of the inside of the chamber 11 below the exhaust plate 14. The exhaust plate 14 confines or reflects the plasma generated in the processing chamber 15, thus preventing leakage of the plasma into the manifold 16.

The exhaust pipe 17 is connected with a TMP (Turbo Molecular Pump) and a DP (Dry Pump) (both are not shown). These pumps evacuate and depressurize the inside of the chamber 11. To elaborate, the DP depressurizes the inside of the chamber 11 to an intermediate vacuum state (e.g., about $1.3 \times 10$ Pa (0.1 Torr) or less) from an atmospheric pressure. Further, in cooperation with the DP, the TMP further depressurizes the inside of the chamber 11 to a high vacuum state (e.g., about $1.3 \times 10^{-3}$ Pa ($1.0 \times 10^{-5}$ Torr) or less) lower than the intermediate pressure state. The internal pressure of the chamber 11 is controlled by an APC valve (not shown).

The susceptor 12 within the chamber 11 is connected with a first high frequency power supply 18 via a first matching unit 19 and also connected with a second high frequency power supply 20 via a second matching unit 21. The first high frequency power supply 18 is configured to apply a high frequency power of a relatively low frequency for ion attraction (e.g., about 2 MHz) to the susceptor 12, and the second high frequency power supply 20 is configured to apply a high frequency power of a relatively high frequency for plasma generation (e.g., about 60 MHz) to the susceptor 12. In this configuration, the susceptor 12 may serve as an electrode. Further, the first and second matching units 19 and 21 may reduce reflection of the high frequency powers from the susceptor 12, thus improving the efficiency of applying the high frequency powers to the susceptor 12.

A step-shaped portion is formed at a periphery of a top portion of the susceptor 12 such that a central portion of the susceptor 12 protrudes upward. Provided at a top end of the central portion of the susceptor 12 is an electrostatic chuck 23 made of ceramics and having an electrostatic electrode plate 22 therein. The electrostatic electrode plate 22 is connected with a DC power supply 24. If a positive DC voltage is applied to the electrostatic electrode plate 22, a negative potential would be generated in a surface (hereinafter, referred to as a "rear surface") of the wafer W facing the electrostatic chuck 23. Therefore, a potential difference is generated between the electrostatic electrode plate 22 and the rear surface of the wafer W. As a result, the wafer W can be attracted to and held on the electrostatic chuck 23 by a Coulomb force or a Johnsen-Rahbek force generated by the potential difference.

Further, the susceptor 12 has therein a cooling device (not shown) of a coolant path. In the present embodiment, the cooling device is configured to absorb, via the susceptor 12, heat of the wafer W of which temperature increases as a result of its contact with the plasma. Therefore, the temperature of the wafer W is prevented from increasing over a desired level.

The susceptor may be made of a conductor such as aluminum in consideration of its heat transfer efficiency or its function as an electrode. Further, in order to prevent the conductor from being exposed to the processing chamber 15 in which the plasma is generated, disposed at the side surface of the susceptor 12 is a side protection member 26 made of a dielectric material such as, but not limited to, quartz ($SiO_2$).

A focus ring 25 is placed on the step-shaped portion (mounting surface) of the susceptor 12 and the side protection member 26 so as to surround the wafer W attracted to and held on the electrostatic chuck 23. The focus ring 25 may be a dual focus ring including an inner focus ring 25*a* surrounding the wafer W and an outer focus ring 25*b* surrounding the inner focus ring 25*a*. The inner focus ring 25*a* and the outer focus ring 25*b* may be made of, but not limited to, silicon (Si) or silicon carbide (SiC). That is, since the focus ring 25 is made of a semiconductor, a distribution range of the plasma can be expanded to above the focus ring 25 as well as above the wafer W. Thus, a plasma density in a region above a periphery portion of the wafer W can be maintained at the substantially same level as a plasma density in a region above a central portion of the wafer W. Accordingly, it is possible to uniformly perform the plasma etching process on the entire surface of the wafer W.

The inner focus ring 25*a* is mainly mounted on the step-shaped portion of the susceptor 12. Meanwhile the outer focus ring 25*b* is mainly mounted on the side protection member 26. Further, a heat transfer sheet 34 made of, e.g., silicon rubber having heat transfer property is provided between the inner focus ring 25*a* and the susceptor 12, as shown in FIG. 2A to be described later. Heat of the inner focus ring 25*a*, of which temperature increases as a result of the contact with the plasma, is transferred to the susceptor 12 via the heat transfer sheet 34 and then absorbed by the cooling device of the susceptor 12. Meanwhile, since no element is provided between the outer focus ring 25*b* and the side protection member 26, if the inner space of the processing chamber 15 is depressurized, a heat insulating vacuum layer is formed between the outer focus ring 25*b* and the side protection member 26. Accordingly, heat of the outer focus ring 25*b*, of which temperature increases as a result of the contact with the plasma, is not transferred to the side protection member 26. As a result, the outer focus ring 25*b* is not cooled, and, thus, the temperature of the outer focus ring 25*b* is maintained at a high level. Accordingly, the temperature of the inner focus ring 25*a* can be maintained at a desired low level, while the temperature of the outer focus ring 25*b* can be maintained at the high level.

A shower head 27 is provided at a ceiling of the chamber 11 so as to face the susceptor 12. The shower head 27 includes an upper electrode plate 28, a cooling plate 29 that supports the upper electrode plate 28 in a detachable manner, and a cover 30 that covers the cooling plate 29. The upper electrode plate 28 is a circular plate-shaped member having a multiple number of gas holes 31 formed in a thickness direction thereof. A buffer room 32 is provided within the cooling plate 29, and a processing gas inlet pipe 33 is connected to the buffer room 32.

In the substrate processing apparatus, a processing gas supplied into the buffer room 32 via the processing gas inlet pipe 33 is introduced into the inner space of the processing chamber 15 through the gas holes 31. The introduced processing gas is excited into plasma by the high frequency power for plasma generation applied into the inner space of the processing chamber 15 from the second high frequency power supply 20 via the susceptor 12. Ions in the plasma are attracted toward the wafer W by the high frequency power for ion attraction applied to the susceptor 12 from the first high frequency power supply 18, and, thus, the plasma etching process is performed on the wafer W.

While the plasma etching process is being performed on the wafer W, reaction products generated as a result of a reaction between an etching target layer of the wafer W and the plasma float in the inner space of the processing chamber 15 and adhere to parts of the processing chamber 15 as deposits. Especially, the deposits tend to adhere to a member having a lower temperature in a gap between two members of which temperatures are greatly different. Accordingly, in a gap between the inner focus ring 25*a* and the outer focus ring 25*b*, the deposits may adhere to the inner focus ring 25*a*. Since the gap between the inner focus ring 25*a* and the outer focus ring 25*b* is narrow and has a labyrinth structure, it may be difficult to remove the deposits adhering to the inner focus ring 25*a*.

In order to solve this problem, in accordance with the first embodiment, a member made of quartz is disposed in the gap between the inner focus ring 25*a* and the outer focus ring 25*b*.

FIGS. 2A-2F provides enlarged cross sectional views illustrating schematic configurations of a focus ring in the substrate processing apparatus of FIG. 1. FIG. 2A shows a focus ring in accordance with the first embodiment of the present disclosure; FIG. 2B, a first modification example of the focus ring in accordance with the first embodiment; FIG. 2C, a second modification example of the focus ring in accordance with the first embodiment; FIG. 2D, a third modification example of the focus ring in accordance with the first embodiment; FIG. 2E, a fourth modification example of the focus ring in accordance with the first embodiment; and FIG. 2F, a fifth modification example of the focus ring in accordance with the first embodiment.

Referring to FIG. 2A, a focus ring 25 has a block member 25*c* (quartz member) made of quartz and disposed in a gap between the inner focus ring 25*a* and the outer focus ring 25*b* (hereinafter, referred to as a "first gap").

When a plasma etching process is performed in the substrate processing apparatus 10, if plasma, especially, radicals enter the first gap to come into contact with the block member 25*c*, the radicals chemically react with the quartz to generate oxygen radicals from the block member 25*c*. If reaction products adhere to the inner focus ring 25*a* as deposits in the first gap, the oxygen radicals immediately make a chemical reaction with the deposits, so that the deposits are decomposed to be removed. Accordingly, it is possible to prevent the deposits from adhering to the inner focus ring 25*a* in the first gap.

It is possible to prevent the deposits from adhering to the inner focus ring 25*a* only if the oxygen radicals are generated in the first gap. Thus, there will be no specific limit in the shape or the size of the block member 25*c* as long as the block member 25*c* is provided in the first gap. Accordingly, the block member 25*c* may have various cross sectional shapes, such as a downwardly protruding cross sectional shape (FIG. 2B), an upwardly protruding cross sectional shape (FIG. 2C), a rectangular cross sectional shape (FIG. 2D), and so forth. In any case, however, it may be desirable that a part of the block member 25*c* is exposed to the inner space of the processing chamber 15. In this way, the block member 25*c* can be effectively contacted with the plasma, and, thus, the oxygen radicals can be sufficiently generated from the block member 25*c*. Alternatively, if the block member 25*c* can make a contact with the plasma that enters the first gap, the block member 25*c* may not be directly exposed to the inner space of the processing chamber 15 (FIG. 2E).

Moreover, the block member 25*c* may be extended to be also placed between a bottom surface of the inner focus ring 25*a* and the step-shaped portion of the susceptor 12 (FIG. 2F). By providing the block member 25*c* in this way, it is possible to prevent reaction products as a source of deposits from entering a gap between the bottom surface of the inner focus ring 25*a* and the step-shaped portion of the susceptor 12. Moreover, since the block member 25*c* also generates oxygen radicals between the bottom surface of the inner focus ring 25*a* and the step-shaped portion of the susceptor 12, decomposition and removal of the deposits by the oxygen radicals can be facilitated in the gap between the bottom surface of the inner focus ring 25a and the step-shaped portion of the susceptor 12. In addition, in this configuration, heat transfer sheets 34a and 34b may be disposed between the step-shaped portion of the susceptor 12 and the block member 25c and between the block member 25c and the inner focus ring 25a, respectively.

Since the block member 25c is made of quartz, silicon radicals as well as the oxygen radicals may be generated when the block member 25c makes a chemical reaction with the plasma. Since the silicon radicals may combine with a silicon simple substance or an oxygen gas to adhere to members within the processing chamber 15 as silicon oxide, it may be desirable to introduce a carbon fluoride (CF)-based processing gas into the inner space of the processing chamber 15. As a result, since plasma generated from the carbon fluoride-based processing gas decomposes silicon or silicon carbide, it is possible to prevent the silicon or silicon carbide from adhering to the members.

Now, a substrate processing apparatus in accordance with a second embodiment of the present disclosure will be described.

Since a configuration and an operation of the second embodiment are basically the same as those of the above-described first embodiment, redundant description will be omitted and only distinctive configuration and operation will be elaborated.

In the substrate processing apparatus 10 of FIG. 1, a gap having a certain width is formed between the side surface of the susceptor 12 and an inner side surface of an inner focus ring 25a in order to easily attach and detach a focus ring 25 to/from the susceptor 12. Since the susceptor 12 is directly cooled by the cooling device embedded therein, a temperature of the susceptor 12 becomes considerably lower than a temperature of the inner focus ring 25a. That is, there may be a great temperature difference between both sides of a gap between the side surface of the susceptor 12 and the inner side surface of the inner focus ring 25a (hereinafter, referred to as a "second gap"). As a result, in the second gap, deposits may adhere to the susceptor 12.

In order to solve this problem, in accordance with the second embodiment, a member made of quartz is disposed in the second gap.

Figure 3A:
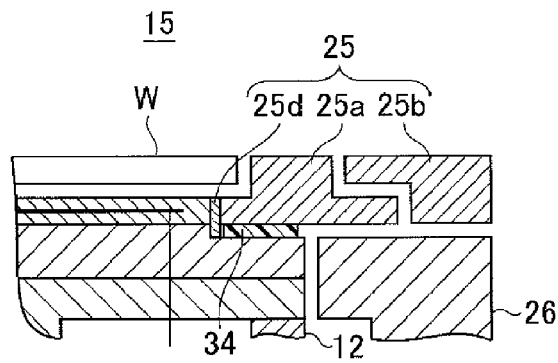
FIGS. 3A-3D provides an enlarged cross sectional views schematically illustrating configurations of a focus ring in a substrate processing apparatus in accordance with a second embodiment of the present disclosure.
Figure 3B:
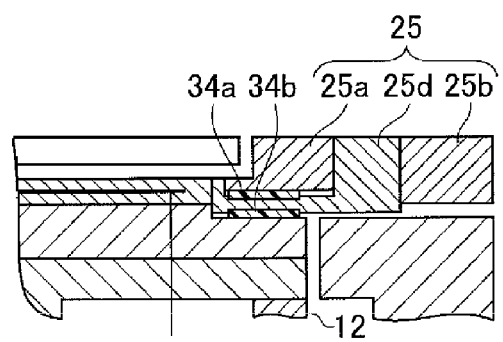
Figure 3C:
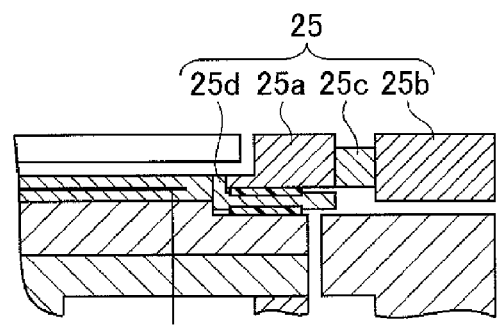

FIGS. 3A-3D provides enlarged cross sectional views schematically illustrating configurations of a focus ring included in the substrate processing apparatus in accordance with the second embodiment. FIG. 3A shows a focus ring in accordance with the second embodiment of the present disclosure; FIG. 3B, a first modification example of the focus ring in accordance with the second embodiment; FIG. 3C, a second modification example of the focus ring in accordance with the second embodiment; and FIG. 3D, a third modification example of the focus ring in accordance with the second embodiment.

Referring to FIG. 3A, the focus ring 25 includes a block member 25d (quartz member) made of quartz and disposed in the second gap.

When a plasma etching process is performed in the substrate processing apparatus 10, if plasma, especially, radicals enter the second gap to come into contact with the block member 25d, oxygen radicals are generated from the block member 25d. The oxygen radicals make a chemical reaction with deposits in the second gap, so that the deposits are decomposed and removed. Accordingly, it is possible to prevent the deposits from adhering to the susceptor 12 in the second gap. Here, there exists a great temperature difference between both sides of the second gap.

It is possible to prevent the deposits from adhering to the susceptor 12 only if the oxygen radicals are generated in the second gap. Thus, there will be no specific limit in the shape or the size of the block member 25d as long as the block member 25d is provided in the second gap. Moreover, the block member 25d may also be provided between the bottom surface of the inner focus ring 25a and the step-shaped portion of the susceptor 12 (FIG. 3B). By providing the block member 25d in this way, it is possible to prevent reaction products as a source of deposits from entering the gap between the bottom surface of the inner focus ring 25a and the step-shaped portion of the susceptor 12. Moreover, since the block member 25d also generates oxygen radicals between the bottom surface of the inner focus ring 25a and the step-shaped portion of the susceptor 12, decomposition and removal of the deposits by the oxygen radicals can be facilitated in the gap between the bottom surface of the inner focus ring 25a and the step-shaped portion of the susceptor 12. In this case, the heat transfer sheets 34a and 34b may be disposed between the step-shaped portion of the susceptor 12 and a bottom surface of the block member 25d and between a top surface of the block member 25d and the inner focus ring 25a, respectively.

Moreover, the block member 25d may be extended to be placed in the first gap (FIG. 3B). With this configuration, it may be possible to prevent deposits from adhering to members in both the first gap and the second gap.

Figure 3D:
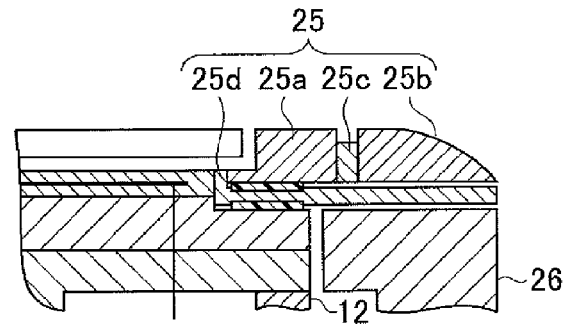

In addition, the focus ring 25 may have a block member 25c as described in the first embodiment as well as the block member 25d (FIG. 3C). Further, the block member 25d may also be provided between a bottom surface of the outer focus ring 25b and a side protection member 26 as well as between the bottom surface of the inner focus ring 25a and the step-shaped portion of the susceptor 12 (FIG. 3D).

Subsequently, a substrate processing apparatus in accordance with a third embodiment will be described.

Since a configuration and an operation of the third embodiment are basically the same as those of the above-described first embodiment, redundant description thereof will be omitted and only distinctive configuration and operation will be elaborated.

Figure 4A:
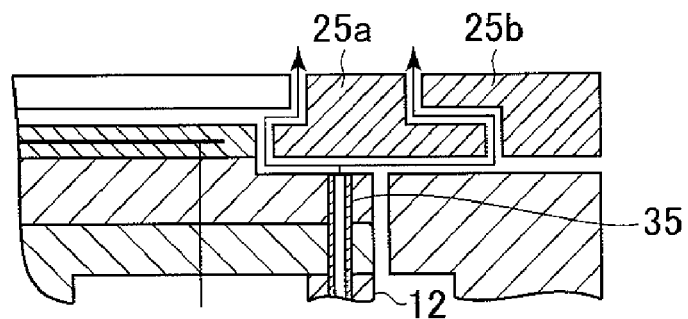
FIGS. 4A-4B provides enlarged cross sectional views schematically illustrating configurations of a focus ring in a substrate processing apparatus in accordance with a third embodiment of the present disclosure.
Figure 4B:
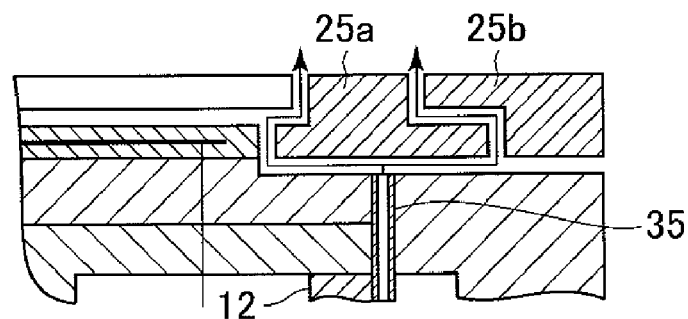

FIGS. 4A-4B provides enlarged cross sectional views schematically illustrating configurations of a focus ring in the substrate processing apparatus in accordance with the third embodiment. FIG. 4A illustrates a focus ring in accordance with third second embodiment, and FIG. 4B illustrates a first modification example of the focus ring in accordance with the third embodiment.

Referring to FIG. 4A, the substrate processing apparatus 10 includes a gas supply port 35 (gas supply device) that is opened at the step-shaped portion of the susceptor 12 and faces the bottom surface of the inner focus ring 25a. The gas supply port 35 supplies a certain gas, e.g., an oxygen gas toward the bottom surface of the inner focus ring 25a when a plasma etching process or a cleaning process using plasma such as WLDC (Wafer Less Dry Cleaning) process is performed in the substrate processing apparatus 10. The supplied oxygen gas (indicated by arrows in FIG. 4) flows between the step-shaped portion of the susceptor 12 and the bottom surface of the inner focus ring 25a and is supplied into at least one of the first and second gaps.

The oxygen gas supplied into the first or the second gap comes into contact with plasma that has entered the first or the second gap, so that oxygen radicals are generated. These oxygen radicals make a chemical reaction with deposits in the first or the second gap, and, thus, the deposits are decomposed to be removed. As a result, in the first or second gap where there exists a great temperature difference, it is possible to prevent the deposits from adhering to the susceptor 12 or the inner focus ring 25*a*. Moreover, the oxygen gas supplied into the first or the second gap pushes out reaction products, which have entered the first or the second gap and would become a source of the deposits, into the inner space of the processing chamber 15. Accordingly, it is possible to further effectively prevent adhesion of the deposits in the first or the second gap.

In the above-described third embodiment, although the gas supply port 35 is formed in the step-shaped portion of the susceptor 12, the position of the gas supply port 35 may not be limited to the step-shaped portion of the susceptor 12 as long as the gas from the gas supply port 35 can be supplied into the first or the second gap. By way of non-limiting example, the gas supply port 35 may be formed between the susceptor 12 and the side protection member 26 (FIG. 4B), or may be formed in the side protection member 26 (not shown).

Further, the gas supplied from the gas supply port 35 may not be limited to the oxygen gas. By way of non-limiting example, a nonreactive gas such as a rare gas, a nitrogen gas, or a processing gas may be supplied instead. The nonreactive gas serves to push out the reaction products that have entered the first or the second gap. Further, since the nonreactive gas does not react with the plasma introduced into the first or second gap, any new reaction products are not produced. Accordingly, it is possible to more effectively prevent adhesion of the deposits in the first or the second gap. Likewise, the processing gas also serves to push out the reaction products entering the first or the second gap. Further, even if the processing gas is introduced into the inner space of the processing chamber 15, it may not affect components of the plasma. Thus, unintended plasma etching may not be performed on the wafer W.

In addition, if the oxygen gas or the processing gas is introduced into the inner space of the processing chamber 15 when these gases are supplied from the gas supply port 35, plasma density or plasma distribution in the inner space of the processing chamber 15 may be affected. In order to solve this problem, in the substrate processing apparatus 10, it may be desirable to reduce an amount of the oxygen gas or the processing gas supplied from a part of a shower head 27 corresponding to the first or the second gap.

Now, a substrate processing apparatus in accordance with a fourth embodiment of the present disclosure will be explained.

Since a configuration and an operation of the fourth embodiment are basically the same as those of the above-described first embodiment, redundant description thereof will be omitted and only distinctive configuration and operation will be elaborated.

Figure 5:
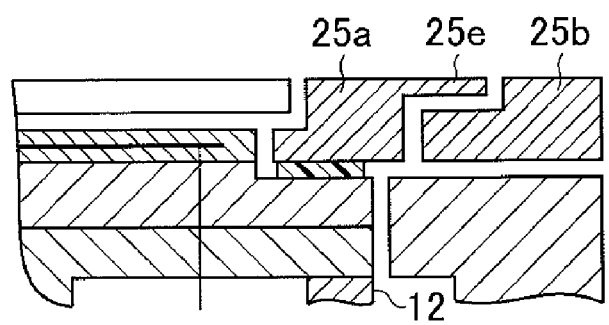
FIG. 5 is an enlarged cross sectional view schematically illustrating a configuration of a focus ring in a substrate processing apparatus in accordance with a fourth embodiment of the present disclosure.

FIG. 5 is an enlarged cross sectional view schematically illustrating a configuration of a focus ring in the substrate processing apparatus in accordance with the fourth embodiment.

Referring to FIG. 5, an inner focus ring 25*a* has a thin plate-shaped flange 25*e* (protrusion) on the side of the inner space of the processing chamber 15. The flange 25*e* is exposed to the inner space of the processing chamber 15 and protrudes so as to cover all or a part of the outer focus ring 25*b*. A first gap is formed between the flange 25*e* and a surface of the outer focus ring 25*b* facing the flange 25*e*. A thickness of the flange 25*e* may be set to be in the range of, but not limited to, about 1.7 mm to about 2.0 mm.

Since the flange 25*e* is thin, heat capacity thereof is small and a temperature thereof is increased higher than that of the remaining part of the inner focus ring 25*a* by radiant heat from plasma when a plasma etching process or a WLDC process is performed in the substrate processing apparatus 10. As a result, in the first gap, a temperature difference between the inner focus ring 25*a* and the outer focus ring 25*b* can be reduced, so that it becomes possible to prevent deposits from adhering to the inner focus ring 25*a* in the first gap. Moreover, even if deposits are attached to the inner focus ring 25*a* in the first gap, the deposits may be decomposed and removed by radiant heat from the flange 25*e* or the outer focus ring 25*b* having high temperatures.

In accordance with the fourth embodiment, since the flange 25*e* is formed to cover all or a part of the outer focus ring 25*b*, the first gap may have a labyrinth structure. As a result, it may be difficult for reaction products as a source of deposits to enter the first gap toward the side of the susceptor 12, and, thus, adhesion of deposits in the first gap can be prevented.

Moreover, since a minimum thickness of the flange 25*e* is e.g., about 1.7 mm, it can be possible to prevent the strength of the flange 25*e* from being critically decreased, and to prevent the flange 25*e* from being broken or damaged while the inner focus ring 25*a* is being replaced. Furthermore, since a maximum thickness of the flange 25*e* is, e.g., about 2.0 mm, it can be prevented that the heat capacity of the flange 25*e* increases beyond a certain level. As a result, it is possible to effectively increase the temperature of the flange 25*e* by the radiant heat from the plasma.

Although there has been described the present disclosure for the respective embodiments, the present disclosure may not be limited to the aforementioned embodiments.

Further, the above-described embodiments may be applicable not only to the plasma processing apparatus 10 configured to perform a plasma etching process on a wafer W for a semiconductor device but also to a plasma processing apparatus configured to process various types of substrates for use in a FPD (Flat Panel Display) including a LCD (Liquid Crystal Display), a photo mask, a CD substrate, a printed substrate, and the like by using plasma.

In the above, there have been described embodiments capable of preventing adhesion of deposits in the first or the second gap. For example, however, if a large quantity of reaction products is generated in the plasma etching process, it may be not possible to completely prevent the adhesion of the deposits in the first or second gap even in accordance with the above-described embodiments.

Below, an example substrate processing apparatus capable of removing deposits in the first or second gap will be elaborated. Examples to be described below can be used together with any of the above-described embodiments of the present disclosure.

Figure 6A:
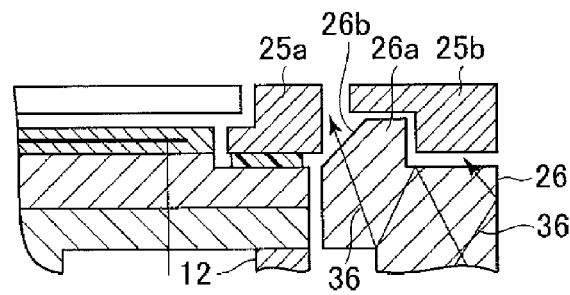
FIGS. 6A-6B provides enlarged cross sectional views illustrating a configuration in the vicinity of a focus ring in a substrate processing apparatus capable of removing an attached deposit.
Figure 6B:
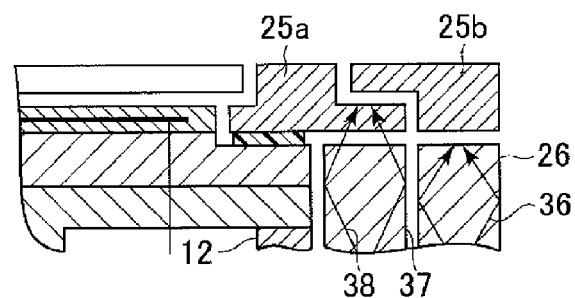

FIGS. 6A-6B presents enlarged cross sectional views each schematically illustrating a configuration in the vicinity of a focus ring in a substrate processing apparatus capable of removing attached deposits. FIG. 6A shows a first example and FIG. 6B shows a second example.

Referring to FIG. 6A, the side protection member 26 has a protrusion 26*a*. The protrusion 26*a* is made of material capable of transmitting a laser beam, e.g., quartz and is formed to upwardly protrude toward a first gap. The protrusion 26*a* has a facing surface 26*b* facing an inner focus ring 25*a* in a first gap. Further, a first laser beam irradiation device (not shown) is provided below the side protection member 26, and the first laser beam irradiation device is configured to irradiate a laser beam 36 for heating the focus ring toward the side protection member 26. By way of non-limiting example, the laser beam 36 may have a wavelength equal to or smaller than about 1100 nm.

The laser beam 36 irradiated to the side protection member 26 is reflected at respective inner surfaces of the side protection member 26 repetitively, and then, finally irradiated to the outer focus ring 25b from an upper portion of the side protection member 26. Since the outer focus ring 25b is made of silicon or silicon carbide, the outer focus ring 25b can absorb the laser beam 36 having the wavelength equal to or smaller than about 1100 nm. As a result, the outer focus ring 25b may be heated by the absorbed laser beam 36. At this time, since the facing surface 26b of the protrusion 26a faces the inner focus ring 25a in the first gap, a part of the laser beam 36 is irradiated toward the inner focus ring 25a from the facing surface 26b. The part of the laser beam irradiated to the inner focus ring 25a can be absorbed by the deposits adhering to the inner focus ring 25a, so that a temperature of the deposits is increased. As a result, it is possible to easily decompose and remove the deposits, so that the deposits adhering to the inner focus ring 25a having a lower temperature in the first gap can be removed.

Further, if the temperature of the deposits is not sufficiently increased because a light amount of a part of the laser beam 36 for heating the focus ring irradiated to the inner focus ring 25a is small, a laser beam different from the laser beam 36 for heating the focus ring, e.g., a laser beam capable of being efficiently absorbed by the deposits may also be irradiated to the side protection member 26, and a part of this another laser beam may be irradiated toward the inner focus ring 25a from the facing surface 26b. In this way, the temperature of the deposits can be increased sufficiently and efficiently.

Moreover, in case that a laser beam cannot be directly irradiated to the first gap, for example, in case that the first gap has a labyrinth structure, a laser beam guide member 37 (laser beam transmitting member) may be provided between a susceptor 12 and the side protection member 26 so as to face the first gap, as illustrated in FIG. 6B. The laser beam guide member 37 is made of quartz and provided as a separate member from the side protection member 26. Further, a second laser beam irradiation device (not shown) may be provided under the laser beam guide member 37. This second laser beam irradiation device may be configured to irradiate a laser beam 38 having a wavelength larger than, e.g., about 1100 nm toward the laser beam guide member 37.

The laser beam 38 irradiated to the laser beam guide member 37 is repetitively reflected at respective inner surfaces of the laser beam guide member 37 while it passes through the laser beam guide member 37, and then, finally irradiated to the first gap from an upper portion of the laser beam guide member 37. Here, since the first gap has a labyrinth structure, a part of the inner focus ring 25a or a part of the outer focus ring 25b may be located on a travel path of the laser beam 38. Since a laser beam having a wavelength larger than about 1100 nm may pass through the silicon or silicon carbide, the laser beam 38 may reach the first gap through the part of the inner focus ring 25a or the part of the outer focus ring 25b. Then, the laser beam 38 may be absorbed by the deposits in the first gap, so that a temperature of the deposit is increased. As a result, the deposits in the first gap can be removed.

Moreover, in case that a component or a member for absorbing the laser beam is not provided between the first gap and the second laser beam irradiation device, the second laser beam irradiation device may be provided at a vicinity of a sidewall of the chamber 11 or at a vicinity of a cover at the top of the chamber 11 as well as provided below the laser beam guide member 37. In this case, it may be desirable to dispose the second laser beam irradiation device to face the first gap.

Figure 7A:
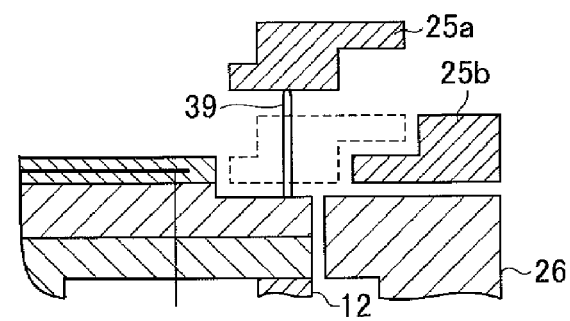
FIGS. 7A-7B provides enlarged cross sectional views illustrating a configuration in the vicinity of a focus ring in a substrate processing apparatus capable of removing an attached deposit.
Figure 7B:
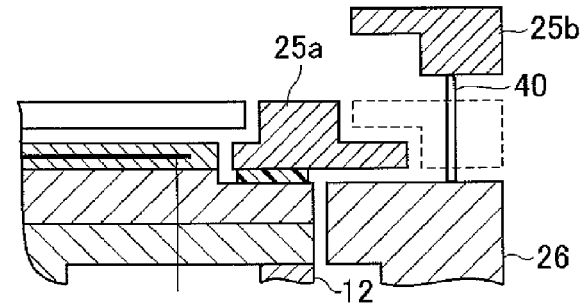

FIGS. 7A-7B provides enlarged cross sectional views each schematically illustrating a configuration in the vicinity of a focus ring in a substrate processing apparatus capable of removing attached deposits. FIG. 7A shows a third example, and FIG. 7B shows a fourth example.

As depicted in FIG. 7A, the substrate processing apparatus 10 further includes a pusher pin 39 configured to be protruded from the step-shaped portion of the susceptor 12. When the pusher pin 39 protrudes upwardly, the pusher pin 39 lifts up the inner focus ring 25a away from the outer focus ring 25b. Typically, if deposits come into contact with plasma, the deposits make a chemical reaction with the plasma, especially, radicals therein, so that the deposits are decomposed to be removed. Here, since the inner focus ring 25a lifted up by the pusher pin 39 is exposed to the plasma within the inner space of the processing chamber 15, deposits adhering to the inner focus ring 25a is easily decomposed and removed. As a result, it may be possible to remove deposits adhering to the inner focus ring 25a having a lower temperature in the first gap Moreover, referring to FIG. 7B, the substrate processing apparatus 10 further includes a pusher pin 40 configured to be protruded from the top surface of the side protection member 26. When the pusher pin 40 protrudes upwardly, the pusher pin 40 lifts up the outer focus ring 25b away from the inner focus ring 25b. In this example, since the outer focus ring 25b is spaced apart from the inner focus ring 25a, deposits adhering to the inner focus ring 25a are exposed to plasma within the inner space of the processing chamber 15. Accordingly, the deposits adhering to the inner focus ring 25a of the lower temperature can be easily decomposed and removed. As a result, it may be possible to remove the deposits adhering to the inner focus ring 25a in the first gap.

The removal of the deposits in the third or fourth example may be performed when a WLDC process is performed in the substrate processing apparatus 10. Further, in the third or fourth example, since the pusher pins are used as members for moving the inner focus ring 25a or the outer focus ring 25b, complication of the structure of the substrate processing apparatus 10 can be avoided.

Figure 8A:
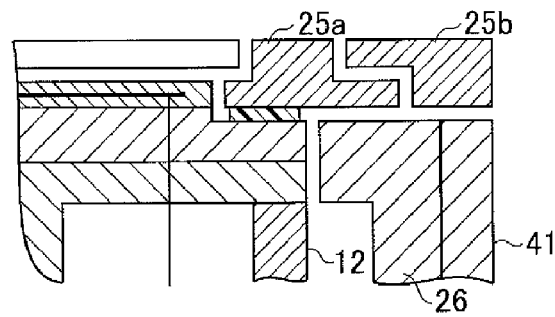
FIGS. 8A-8D provides enlarged cross sectional views illustrating a configuration in the vicinity of a focus ring included in a substrate processing apparatus capable of removing an attached deposit.
Figure 8B:
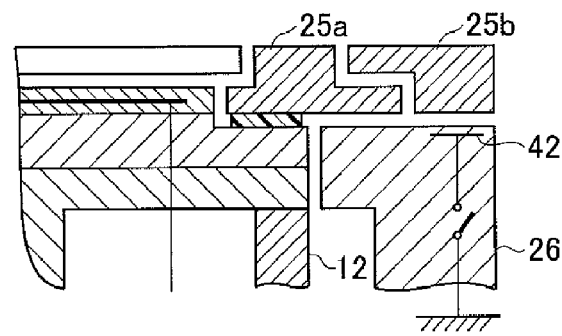
Figure 8C:
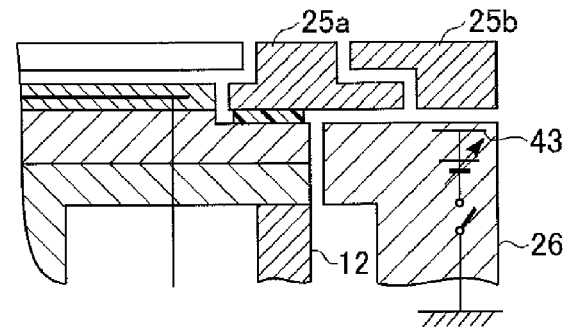

FIGS. 8A-8D provides enlarged cross sectional views each schematically illustrating a configuration in the vicinity of a focus ring in a substrate processing apparatus capable of removing attached deposits. FIG. 8A depicts a fifth example; FIG. 8B, a sixth example; FIG. 8C, a seventh example; and FIG. 8D, an eighth example.

Referring to FIG. 8A, the substrate processing apparatus 10 further includes a grounding member 41 made of a semiconductor or a conductor (e.g., silicon). The grounding member 41 is provided under the outer focus ring 25b at an outside of the side protection member 26. An electric potential of the grounding member 41 is maintained as a ground potential.

In the present example, since the grounding member 41 is provided near the outer focus ring 25b, an electric potential of the outer focus ring 25b may also become close to the ground potential. Meanwhile, since a negative bias potential is generated in the susceptor 12 or the inner focus ring 25a, the electric potential of the outer focus ring 25b becomes relatively higher, so that electrons can be easily attracted to the outer focus ring 25b. As a result, the thickness of a sheath corresponding to the outer focus ring 25b may be increased, and plasma in the inner space of the processing chamber 15 can be concentrated on a position corresponding to the inner focus ring 25a as compared to a position corresponding to the outer focus ring 25b. Accordingly, a plasma density corresponding to the first gap or the second gap can be increased, so that plasma reaching the first or second gap can also be increased. Consequently, deposits in the first or second gap by the plasma can be easily decomposed, so that it becomes possible to remove deposits adhering to the inner focus ring 25a having a lower temperature in the first gap and, also, deposits adhering to the susceptor 12 having an even lower temperature in the second gap.

Referring to FIG. 8B, the substrate processing apparatus 10 further includes a ground electrode 42 having a ground potential. The ground electrode 42 is provided within the side protection member 26 to be located near a focus ring 25.

In this example, since the ground electrode 42 is provided near the outer focus ring 25b, an electric potential of the outer focus ring 25b may also become close to the ground potential. As a result, the plasma in the inner space of the processing chamber 15 can be concentrated on a position corresponding to the inner focus ring 25a as compared to a position corresponding to the outer focus ring 25b. Accordingly, a plasma density corresponding to the first gap or the second gap can be increased, so that it becomes possible to remove deposits adhering to the inner focus ring 25a having the lower temperature in the first gap and, also, deposits adhering to the susceptor 12 having the even lower temperature in the second gap.

Referring to FIG. 8C, the substrate processing apparatus 10 further includes a positive potential electrode 43 provided within the side protection member 26 to be located near the outer focus ring 25b. A positive voltage is applied to the positive potential electrode 43.

In the present example, since the positive potential electrode 43 is disposed near the outer focus ring 25b, the outer focus ring 25b may also have a positive potential. As a result, the plasma in the inner space of the processing chamber 15 can be further concentrated on a position corresponding to the inner focus ring 25a as compared to a position corresponding to the outer focus ring 25b. Accordingly, a plasma density corresponding to the first gap or the second gap can be increased, so that it becomes possible to remove deposits adhering to the inner focus ring 25a having the lower temperature in the first gap and, also, deposits adhering to the susceptor 12 having the even lower temperature in the second gap.

Figure 8D:
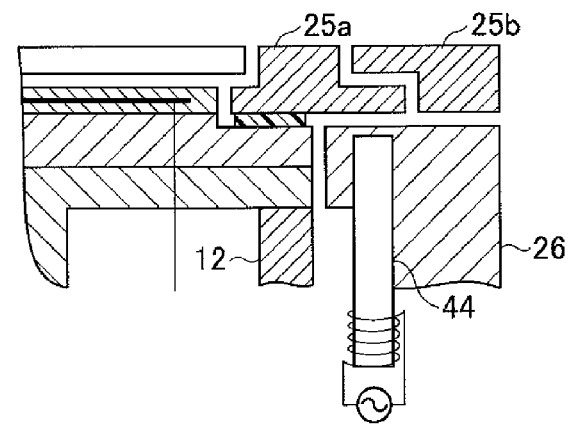

Referring to FIG. 8D, the substrate processing apparatus 10 further includes an electromagnet 44 provided in the vicinity of the first gap to be located below the focus ring 25.

In the present example, the electromagnet 44 may serve to generate a magnetic field around the first gap, thus concentrating the plasma in the inner space of the processing chamber 15 on a position corresponding to the inner focus ring 25a as compared to a position corresponding to the outer focus ring 25b. Accordingly, a plasma density corresponding to the first gap or the second gap can be increased, so that it becomes possible to remove deposits adhering to the inner focus ring 25a having the lower temperature in the first gap and, also, deposits adhering to the susceptor 12 having the even lower temperature in the second gap.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:

1. A deposit removing method for removing deposits from an inner ring of a substrate processing apparatus comprising a chamber; a susceptor for mounting thereon a substrate provided in the chamber; the inner ring positioned in the chamber so as to surround the susceptor; an outer ring placed so as to surround the inner ring; and a plasma generator configured to generate plasma in the chamber, wherein the deposit removing method comprises:
lifting the inner ring away from a top surface of the susceptor when the substrate is not on the susceptor, wherein the inner ring is lifted to such a position that a bottom surface of the inner ring is higher than the top surface of the susceptor and deposits adhering to the inner ring are exposed;
generating plasma in the chamber; and
exposing the inner ring to the plasma while the inner ring is lifted to decompose and remove the deposits therefrom.

2. The deposit removing method of claim 1,
wherein, in the lifting of the inner ring, the inner ring is lifted to such a position that the bottom surface of the inner ring is higher than a top surface of the outer ring.

3. The deposit removing method of claim 1,
wherein a portion of the inner ring and a portion of the outer ring overlap each other.

4. The deposit removing method of claim 1,
wherein the substrate processing apparatus further comprises a lifter configured to lift up the inner ring.

5. The deposit removing method of claim 1,
wherein the susceptor comprises an electrostatic chuck configured to hold the substrate thereon.

6. The deposit removing method of claim 1,
wherein the substrate processing apparatus further comprises a side protection member disposed to surround the susceptor.

7. The deposit removing method of claim 1, further comprising:
lifting the outer ring away from the inner ring when the substrate is not on the susceptor.

8. The deposit removing method of claim 3,
wherein the portion of the inner ring comprises an outer circumferential portion of the inner ring, and
the portion of the outer ring comprises an inner circumferential portion of the outer ring.

9. The deposit removing method of claim 4,
wherein, in the lifting of the inner ring, the lifter is in contact with the bottom surface of the inner ring.

10. The deposit removing method of claim 6,
wherein the outer ring and the side protection member overlap each other.

11. A substrate processing method comprising:
placing a substrate on a susceptor in a chamber, the substrate being surrounded by an inner ring and an outer ring wherein the outer ring is placed so as to surround the inner ring in the chamber;
etching the substrate by generating a first plasma in the chamber;
unloading the substrate from the chamber;
lifting the inner ring away from a top surface of the susceptor in a state that the substrate is not on the susceptor; and
generating a second plasma in the chamber;

lifting the inner ring in the chamber to expose deposits adhering to the inner ring, wherein the inner ring is lifted to such a position that a bottom surface of the inner ring is higher than the top surface of the susceptor; and exposing the inner ring to the second plasma while the inner ring is lifted to decompose and remove the deposits in the chamber.

* * * * *

UNITED STATES PATENT AND TRADEMARK OFFICE
CERTIFICATE OF CORRECTION

| | |
|---|---|
| PATENT NO. | : 11,935,727 B2 |
| APPLICATION NO. | : 16/990166 |
| DATED | : March 19, 2024 |
| INVENTOR(S) | : Jun Yamawaku et al. |

It is certified that error appears in the above-identified patent and that said Letters Patent is hereby corrected as shown below:

In the Specification

Column 1, Line 62, "aching" should be -- ashing --.

Signed and Sealed this
Fifth Day of November, 2024

Katherine Kelly Vidal
*Director of the United States Patent and Trademark Office*